United States Patent
Lee

(10) Patent No.: US 10,116,293 B2
(45) Date of Patent: Oct. 30, 2018

(54) INPUT BUFFER CIRCUIT

(71) Applicant: SK hynix Inc., Icheon-si Gyeonggi-do (KR)

(72) Inventor: Kwang Hun Lee, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/499,238

(22) Filed: Apr. 27, 2017

(65) Prior Publication Data

US 2018/0131355 A1 May 10, 2018

(30) Foreign Application Priority Data

Nov. 8, 2016 (KR) .................. 10-2016-0148014

(51) Int. Cl.
*H03K 5/15* (2006.01)
*H03K 5/00* (2006.01)

(52) U.S. Cl.
CPC ..... *H03K 5/15* (2013.01); *H03K 2005/00019* (2013.01)

(58) Field of Classification Search
CPC ...... H03K 5/1565; H03K 5/135; H03K 17/16; H03K 5/133; H03K 5/134; H03K 5/131; H03K 5/01; H03K 5/151; H03K 2005/00019
USPC .......................... 327/108, 110, 112, 270, 272
See application file for complete search history.

(56) References Cited

U.S. PATENT DOCUMENTS

| | | | |
|---|---|---|---|
| 6,104,225 A | 8/2000 | Taguchi et al. | |
| 6,288,585 B1* | 9/2001 | Bando | G11C 7/1078 327/111 |
| 6,339,553 B1* | 1/2002 | Kuge | G11C 7/1066 327/291 |
| 6,385,127 B1* | 5/2002 | Ikeda | G11C 7/1078 365/189.05 |
| 7,348,823 B2 | 3/2008 | Takai et al. | |
| 9,006,840 B2 | 4/2015 | Shin et al. | |
| 2015/0100814 A1 | 4/2015 | Hyun et al. | |

\* cited by examiner

*Primary Examiner* — John Poos
(74) *Attorney, Agent, or Firm* — William Park & Associates Ltd.

(57) ABSTRACT

An input buffer circuit is disclosed, which relates to a technology for a receiver circuit including a plurality of input buffers having different characteristics. The input buffer circuit includes a first buffer configured to output a first input signal by buffering a command address received based on a flag signal, a second buffer configured to output a second input signal by buffering the command address based on the flag signal, a first delay matching circuit configured to output a first matching signal by delaying the first input signal by a first delay time, a second delay matching circuit configured to output a second matching signal by delaying the second input signal by a second delay time, and a selection circuit configured to select any one of the first matching signal and the second matching signal based on a selection signal.

11 Claims, 12 Drawing Sheets

INPUT BUFFER CIRCUIT

CROSS-REFERENCE TO RELATED APPLICATION

This application claims priority based upon Korean patent application No. 10-2016-0148014, filed on Nov. 8, 2016, the disclosure of which is hereby incorporated by reference in its entirety herein.

BACKGROUND OF THE INVENTION

1. Technical Field

Embodiments of the present disclosure may generally relate to an input buffer circuit, and more particularly to a technology for a receiver circuit including a plurality of input buffers having different characteristics.

2. Related Art

A semiconductor device operates by various external commands, for example, a clock enable command, an impedance control command, etc. The semiconductor device includes a command buffer circuit for receiving signals (i.e., command signals) needed to define such commands.

Setup/hold times may be used as representative examples of important parameters to be guaranteed during a write operation of a semiconductor integrated circuit (IC) (i.e., a semiconductor memory). Addresses to be input only when the setup time and the hold time have proper margins can be correctly centered upon a clock signal, such that data can be correctly recorded in a memory region.

The semiconductor memory device may selectively use different kinds of input buffers (i.e., heterogeneous input buffers) to reduce power consumption. In more detail, the semiconductor memory device may include a first input buffer having high-performance and high-current characteristics to increase driving capability, and a second input buffer having lower-performance and lower-current characteristics to reduce power consumption.

However, if the semiconductor memory device performs switching between different input buffers having different performances according to operation modes, a margin of the setup/hold time is reduced due to a difference in performance between different input buffers. That is, a delay offset associated with a clock signal occurs due to a difference in performance between different input buffers having different characteristics. As a result, a margin of the setup time or the hold time of the input buffer circuit is reduced .

BRIEF SUMMARY OF THE INVENTION

Various embodiments of the present disclosure are directed to providing an input buffer circuit that substantially obviates one or more problems due to limitations and disadvantages of the related art.

The embodiment of the present disclosure relates to an input buffer circuit for reducing a delay offset of a receiver circuit including a plurality of input buffers having different characteristics.

In accordance with an embodiment of the present disclosure, an input buffer circuit includes: a first buffer configured to output a first input signal by buffering a command address received based on a flag signal; a second buffer configured to output a second input signal by buffering the command address based on the flag signal; a first delay matching circuit configured to output a first matching signal by delaying the first input signal by a first delay time; a second delay matching circuit configured to output a second matching signal by delaying the second input signal by a second delay time; and a selection circuit configured to select any one of the first matching signal and the second matching signal based on a selection signal.

In accordance with another embodiment of the present disclosure, an input buffer circuit includes: a first buffer configured to buffer a command address received based on a selection signal; a second buffer configured to buffer the command address based on the selection signal, and have characteristics different from those of the first buffer; and a variable delay matching circuit configured to delay an output signal of the first buffer and an output signal of the second buffer, and control a delay time in different ways according to the selection signal.

It is to be understood that both the foregoing general description and the following detailed description of the present disclosure are exemplary and explanatory and are intended to provide further explanation of the invention as claimed.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Reference will now be made in detail to embodiments of the present disclosure, examples of which are illustrated in the accompanying drawings. Wherever possible, the same reference numbers are used throughout the drawings to refer to the same or like portions. In the following description of the present disclosure, a detailed description of related known configurations or functions incorporated herein may be omitted for clarity of the subject matter of the present disclosure.

Figure 1:
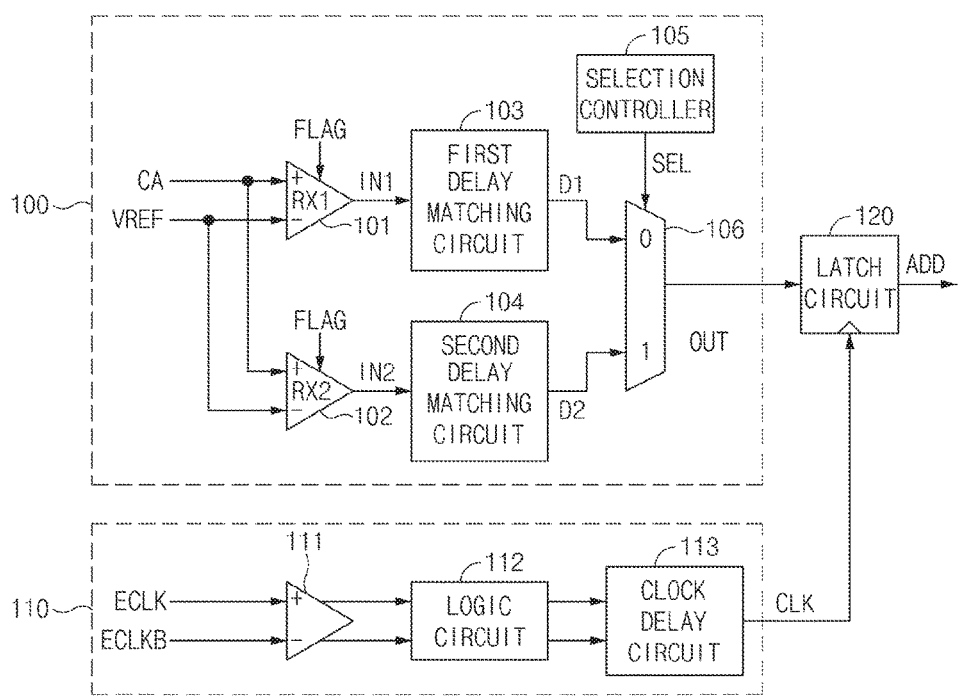
FIG. 1 is a block diagram illustrating a representation of an example input buffer circuit according to an embodiment of the present disclosure.

FIG. 1 is a block diagram illustrating a representation of an example of an input buffer circuit according to an embodiment of the present disclosure.

Referring to FIG. 1, the input buffer circuit may include an input circuit 100, a clock input circuit 110, and a latch circuit 120.

The input circuit 100 may output an output signal OUT by buffering a command address CA. The input circuit 100 may include a first buffer (RX1) 101, a second buffer (RX2) 102, a first delay matching circuit 103 and a second delay matching circuit 104, a selection controller 105, and a selection circuit 106.

The first buffer 101 and the second buffer 102 may have different characteristics. The first buffer 101 and the second buffer 102 may operate in a complementary manner according to a flag signal FLAG.

For example, the first buffer 101 may have high-performance and high-current characteristics to increase its driving capability. That is, a large amount of current is used in a high-speed operation mode, such that the first buffer 101 is used.

The second buffer 102 may have low-performance and low-current characteristics to reduce power consumption. That is, because a small amount of current is used in a low-speed operation mode, the second buffer 102 may be used in a low-speed operation.

The first buffer 101 may buffer the command address CA based on the flag signal FLAG, and may output an input signal IN1. The first buffer 101 may compare the command address CA activated when the flag signal FLAG is at a first logic level with a reference voltage VREF, may buffer the comparison result, and may output an input signal IN1.

The second buffer 102 may buffer the command address CA based on the flag signal FLAG, and may output an input signal IN2. The second buffer 102 may compare the command address CA activated when the flag signal FLAG is at a second logic level with the reference voltage VREF, may buffer the comparison result, and may output an input signal IN2.

The first delay matching circuit 103 may adjust delay of the input signal IN1 received from the first buffer 101 to delay the input signal IN1 for a first delay time, and may output a first matching signal D1. The second delay matching circuit 104 may adjust delay of the input signal IN2 received from the second buffer 102 to delay the input signal IN2 for a second delay time, and may output a second matching signal D2.

In this case, the first delay matching circuit 103 and the second delay matching circuit 104 may have different delay times. For example, the first delay matching circuit 103 may have a longer delay time than the second delay matching circuit 104. That is, a compensation value of a delay amount corresponding to characteristics of the first buffer 101 may be predetermined in the first delay matching circuit 103. A compensation value of a delay amount corresponding to characteristics of the second buffer 102 may be predetermined in the second delay matching circuit 104.

A difference in delay amount between the first buffer 101 and the second buffer 102 can be sufficiently estimated in a design stage of a buffer circuit. Therefore, the delay amount to be corrected in each of the delay matching circuits 103 and 104 may be pre-established in the design stage of the buffer circuit.

In addition, the selection controller 105 may output a selection signal SEL for controlling a selection operation of the selection circuit 106. Here, the selection controller 105 may control the selection signal SEL based on a frequency or an operation mode signal from an external controller. That is, the selection controller 105 may output a selection signal SEL for selecting any one of the output signal of the first buffer 101 and the output signal of the second buffer 102.

The selection circuit 106 may select any one of the first matching signal D1 or the second matching signal D2 based on the selection signal SEL, and may output an output signal OUT. For example, if the selection signal SEL is at a first logic level, the selection circuit 106 may select the first matching signal D1, and may output the selection result indicating that the first matching signal D1 was selected as the output signal OUT. In contrast, if the selection signal SEL is at a second logic level, the selection circuit 106 may select the second matching signal D2, and may output the selection result indicating that the second matching signal D2 was selected as the output signal OUT.

The clock input circuit 110 may buffer external clock signals ECLK and ECLKB, and may output a clock signal CLK. Here, the external clock signal ECLKB may have a phase opposite to that of the other external clock signal ECLK.

The clock input circuit 110 may include a clock buffer 111, a logic circuit 112, and a clock delay circuit 113. The clock buffer 111 may buffer the external clock signal ECLK received from the external part.

The logic circuit 112 may control a logic level of an output clock signal received from the clock buffer 111. In addition, the clock delay circuit 113 may output the clock signal CLK by delaying an output signal of the logic circuit 112. The latch circuit 120 may latch the output signal OUT by synchronizing with the clock signal CLK, and may output an address ADD. Thus, the latch circuit 120 may latch the output signal OUT of the selection circuit 106 based on the clock signal CLK, and output the address ADD.

A transmission path through which the command address CA arrives at the latch circuit 120 after passing through the first buffer 101 and the second buffer 102 is referred to as an address path. A transmission path through which the external clock signal ECLK or ECLKB arrives at the latch circuit 120 after passing through the logic circuit 112 and the clock delay circuit 113 is referred to as a clock path.

If the same delay is applied to the address path and the clock path, a mismatch between the address and the clock may occur in the latch circuit 120. In order to obviate the mismatch between the address path and the clock path, the input buffer circuit according to an embodiment may include a matching circuit capable of matching delay generated from the address path.

However, it is assumed that only one matching circuit is present in the output path of the first buffer 101 and the second buffer 102. As a result, delay of the latch circuit 120 may be changed by different performance characteristics of the first buffer 101 and the second buffer 102. That is, if switching between the first buffer 101 and the second buffer 102 is performed according to the operation mode, a delay difference between the first buffer 101 and the second buffer 102 may occur, resulting in reduction of a timing margin of the latch circuit 120.

The embodiment of the present disclosure may include a first delay matching circuit 103 corresponding to the first buffer 101 and a second delay matching circuit 104 corresponding to the second buffer 102, such that the selection controller 105 may select any one of the output signals of the two matching circuits 103 and 104. The selection controller 105 selects the output signal of the first delay matching circuit 103 or the second delay matching circuit 104 when switching of the first buffer 101 or the second buffer 102 is performed, such that a delay difference does not occur in the latch circuit 120 and a timing margin is not reduced.

Figure 2:
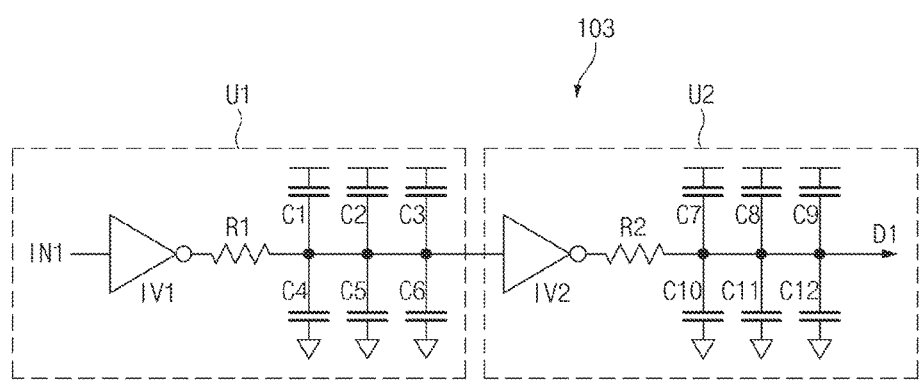
FIGS. 2 and 3 are detailed circuit diagrams illustrating a representation of an example delay matching circuit shown in FIG. 1.

FIG. 2 is a detailed circuit diagram illustrating a representation of an example of the first delay matching circuit 103 shown in FIG. 1.

Referring to FIG. 2, the first delay matching circuit 103 may output a matching signal D1 by adjusting a delay of the input signal IN1 received from the first buffer 101. The first delay matching circuit 103 may include a pair of unit delay circuits U1 and U2, configured such that the first delay matching circuit 103 may delay the input signal IN1 without inversion of a phase.

The unit delay circuit U1 may inversion-delay the input signal IN1. The unit delay circuit U1 may include an inverter IV1, a resistor R1, and a plurality of capacitors C1 to C6.

The inverter IV1 may inversion-drive the input signal IN1. One terminal of the resistor R1 may be coupled to an output terminal of the inverter IV1. Capacitors C1 to C3 of a first group of capacitors from among the plurality of capacitors C1 to C6 may be coupled in parallel between an other terminal, an output terminal, of the resistor R1 and a power-supply voltage terminal. Capacitors C4 to C6 of a second group of capacitors from among the plurality of capacitors C1 to C6 may be coupled in parallel between a ground voltage terminal and the other terminal of the resistor R1.

The unit delay circuit U2 may inversion-delay the output signal of the unit delay circuit U1. The unit delay circuit U2 may include an inverter IV2, a resistor R2, and a plurality of capacitors C7 to C12.

The inverter IV2 may inversion-drive the output signal of the unit delay circuit U1. One terminal of the resistor R2 may be coupled to an output terminal of the inverter IV2. In addition, capacitors C7 to C9 of a first group of capacitors from among the plurality of capacitors C7 to C12 may be coupled in parallel between the power-supply voltage terminal and the other terminal of the resistor R2. Capacitors C10 to C12 of a second group of capacitors from among the plurality of capacitors C7 to C12 may be coupled in parallel between a ground voltage terminal and the other terminal of the resistor R2.

Figure 3:
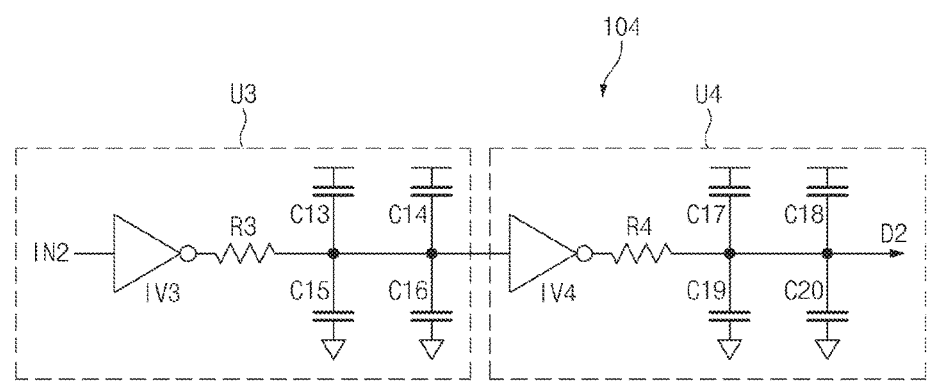

FIG. 3 is a detailed circuit diagram illustrating a representation of an example of the second delay matching circuit 104 shown in FIG. 1.

Referring to FIG. 3, the second delay matching circuit 104 may output a matching signal D2 by adjusting a delay of the input signal IN2 received from the second buffer 102. The second delay matching circuit 104 may include a pair of unit delay circuits U3 and U4, configured such that the second delay matching circuit 104 may delay the input signal IN2 without inversion of the phase.

The unit delay circuit U3 may inversion-delay the input signal IN2. The unit delay circuit U3 may include an inverter IV3, a resistor R3, and a plurality of capacitors C13 to C16.

The inverter IV3 may inversion-drive the input signal IN2. One terminal of the resistor R3 may be coupled to an output terminal of the inverter IV3. In addition, capacitors C13 and C14 of a first group of capacitors from among the plurality of capacitors C13 to C16 may be coupled in parallel between a power-supply voltage terminal and an other terminal, an output terminal, of the resistor R3. Capacitors C15 and C16 of a second group of capacitors from among the plurality of capacitors C15 and C16 may be coupled in parallel between a ground voltage terminal and the other terminal of the resistor R3.

The unit delay circuit U4 may inversion-delay the output signal of the unit delay circuit U3. The unit delay circuit U4 may include an inverter IV4, a resistor R4, and a plurality of capacitors C17 to C20.

The inverter IV4 may inversion-drive the output signal of the unit delay circuit U3. One terminal of the resistor R4 may be coupled to an output terminal of the inverter IV4. Capacitors C17 and C18 of a first group of capacitors from among the plurality of capacitors C17 to C20 may be coupled in parallel between the power-supply voltage terminal and the other terminal of the resistor R4. Capacitors C19 and C20 of a second group of capacitors from among the plurality of capacitors C17 to C20 may be coupled in parallel between a ground voltage terminal and the other terminal of the resistor R4.

As described above, the first delay matching circuit 103 and the second delay matching circuit 104 may have different delay times. That is, the number of capacitors contained in the second delay matching circuit 104 is less than the number of capacitors contained in the first delay matching circuit 103.

Because the number of capacitors contained in the second delay matching circuit 104 is less than the number of capacitors C13 to C20 contained in the first delay matching circuit 103, the second delay matching circuit 104 may have a relatively shorter delay time than the first delay matching circuit 103 according to a capacitance value. In contrast, because the number of capacitors contained in the first delay matching circuit 103 is greater than the number of capacitors contained in the second delay matching circuit 104, the first delay matching circuit 103 may have a relatively longer delay time than the second delay matching circuit 104 according to a capacitance value.

Therefore, the number of capacitors of each of the delay matching circuits 103 and 104 may be adjusted according to a delay amount of the first buffer 101 and a delay amount of the second buffer 102, such that matching a difference in the delay amount between the first buffer 101 and the second buffer 102 is achieved. This embodiment of the present disclosure compensates for an offset delay between the first buffer 101 and the second buffer 102, such that a timing margin is not reduced in the latch circuit 120.

Figure 4:
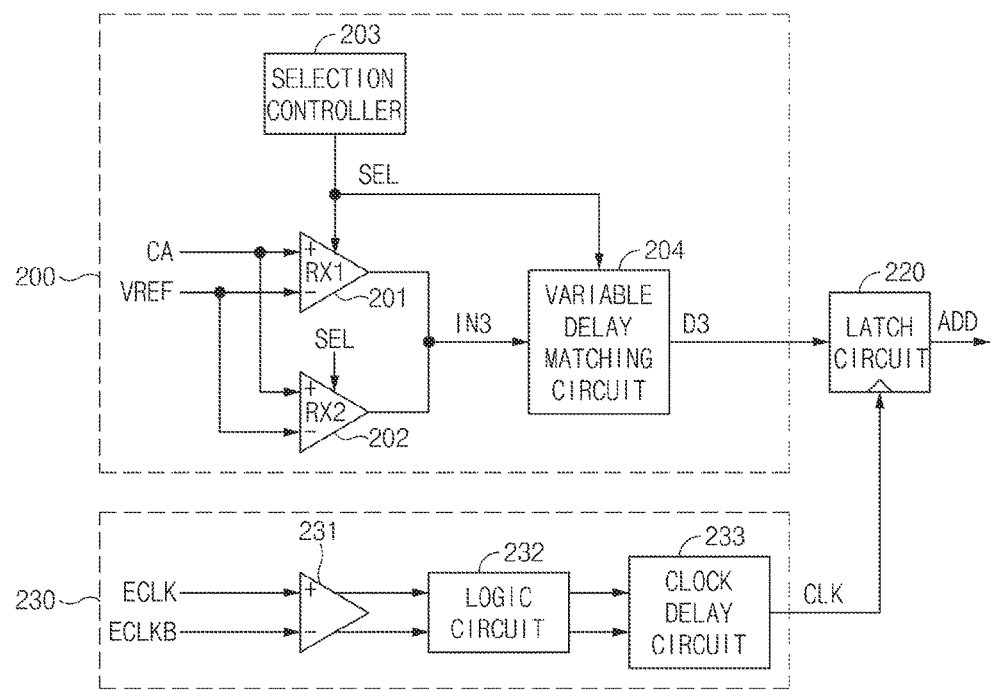
FIG. 4 is a block diagram illustrating a representation of an example input buffer circuit according to another embodiment of the present disclosure.

FIG. 4 is a block diagram illustrating a representation of an example of the input buffer circuit according to another embodiment of the present disclosure.

Referring to FIG. 4, the input buffer circuit may include an input circuit 200, a latch circuit 220, and a clock input circuit 230.

The input circuit 200 may output a matching signal D3 by buffering the command address CA. The input circuit 200 may include a first buffer (RX1) 201, a second buffer (RX2) 202, a selection controller 203, and a variable delay matching circuit 204.

The first buffer 201 and the second buffer 202 may have different characteristics. The first buffer 201 and the second buffer 202 may operate in a complementary manner according to a selection signal SEL.

For example, the first buffer 201 may have high-performance and high-current characteristics to increase the driving capability of the first buffer 201. That is, a large amount of current is used in a high-speed operation mode, such that the first buffer 201 is used.

The second buffer 202 may have low-performance and low-current characteristics to reduce power consumption. That is, because a small amount of current is used in a low-speed operation mode, the second buffer 202 may be used in a low-speed operation.

The first buffer 201 may buffer the command address CA which may be received based on the selection signal SEL, and may output an input signal IN3. The first buffer 201 may compare the command address CA activated when the selection signal SEL is at a first logic level with a reference voltage VREF, may buffer the comparison result, and may output an input signal IN3.

The second buffer 202 may buffer the command address CA based on the selection signal SEL, and may output an input signal IN3. The second buffer 202 may compare the command address CA activated when the selection signal SEL is at a second logic level with the reference voltage VREF, may buffer the comparison result, and may output an input signal IN3.

The selection controller 203 may output the selection signal SEL for selecting any one of the first buffer 201 and the second buffer 202. Here, the selection controller 203 may generate the selection signal SEL upon receiving a frequency or an operation mode signal from an external controller.

Upon receiving the selection signal SEL, the variable delay matching circuit 204 may variably adjust delay of the input signal IN3 received from the first buffer 201 or the second buffer 202, and may output a matching signal D3.

In this case, the variable delay matching circuit 204 may adjust the delay time in different ways according to the selection signal SEL. For example, if the selection signal SEL is at a first logic level, the variable delay matching circuit 204 may adjust the delay time using a compensation value of the delay amount corresponding to characteristics of the first buffer 201. If the selection signal SEL is at a second logic level, the variable delay matching circuit 204 may adjust the delay time using a compensation value of the delay amount corresponding to characteristics of the second buffer 202.

A difference in delay amount between the first buffer 201 and the second buffer 202 can be sufficiently estimated in a design stage of the buffer circuit. Therefore, the delay amount to be corrected in the variable delay matching circuit 204 may be pre-established in the design stage of the buffer circuit.

The latch circuit 220 may latch the matching signal D3 by synchronizing with the clock signal CLK, and may output an address ADD. The clock input circuit 230 may buffer the external clock signals ECLK and ECLKB, and may output the clock signal CLK. In this case, the external clock signal ECLKB may have a phase opposite to that of the other external clock signal ECLK.

The clock input circuit 230 may include a clock buffer 231, a logic circuit 232, and a clock delay circuit 233. The clock buffer 231 may buffer the external clock signal ECLK received from the external part.

The logic circuit 232 may control a logic level of the output clock signal received from the clock buffer 231. The clock delay circuit 233 may delay an output signal of the logic circuit 232, and may output the clock signal CLK.

The embodiment of the present disclosure may include a variable delay matching circuit 204 configured to compensate for a delay time caused by a difference in delay between the first buffer 201 and the second buffer 202. The embodiment of the present disclosure variably compensates for a difference in delay time between the first buffer 201 and the second buffer 202, such that a timing margin is prevented from being reduced in the latch circuit 220.

Figure 5:
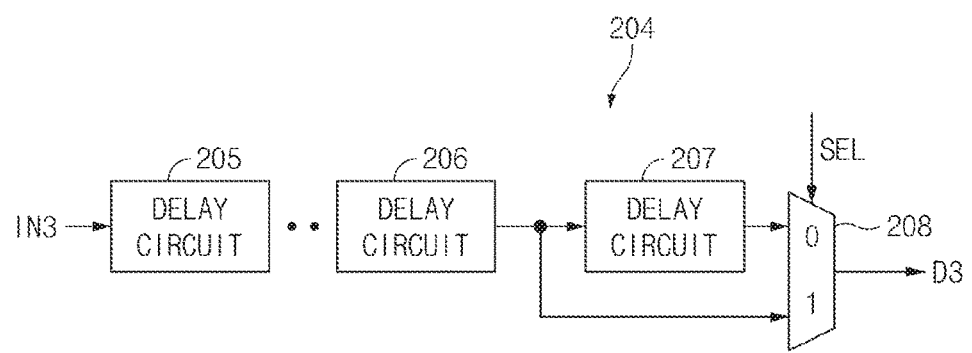
FIG. 5 is a detailed circuit diagram illustrating a representation of an example variable delay matching circuit shown in FIG. 4.

FIG. 5 is a detailed circuit diagram illustrating a representation of an example of the variable delay matching circuit 204 shown in FIG. 4.

Referring to FIG. 5, the variable delay matching circuit 204 may include a plurality of delay circuits 205 to 207 and a selection circuit 208.

The plurality of delay circuits 205 to 207 may delay the input signal IN3 which may correspond to the output signal of the first buffer 201 or the second buffer 202 of FIG. 4, and may output the delayed input signal IN3.

Although the embodiment of the present disclosure has exemplarily disclosed that the number of delay circuits 205 to 207 is set to 3 for convenience of description, the scope or spirit of the present disclosure is not limited thereto, and the number of delay circuits 205 to 207 may be sufficiently changed as necessary.

The selection circuit 208 may select an output signal of any delay circuit selected from among the plurality of delay circuits 205 to 207 in response to the selection signal SEL, and may output the selection result as a matching signal D3. It is assumed that the number of delay circuits 205 to 207 is set to N. As a result, the selection circuit 208 may output an output signal of the delay circuit 207 of the last N-th stage, or may output an output signal of the delay circuit 206 of the (N−1)-th stage, etc.

For example, the selection circuit 208 may select an output signal of the delay circuit 207 when the selection signal SEL is at a first logic level, and may output the selection result as a matching signal D3.

That is, looking briefly at FIG. 4, if the first buffer 201 is selected by the selection signal SEL, a relatively longer delay time may be used. In contrast, if the second buffer 202 is selected by the selection signal SEL, a relatively shorter delay time may be used.

Figure 6:
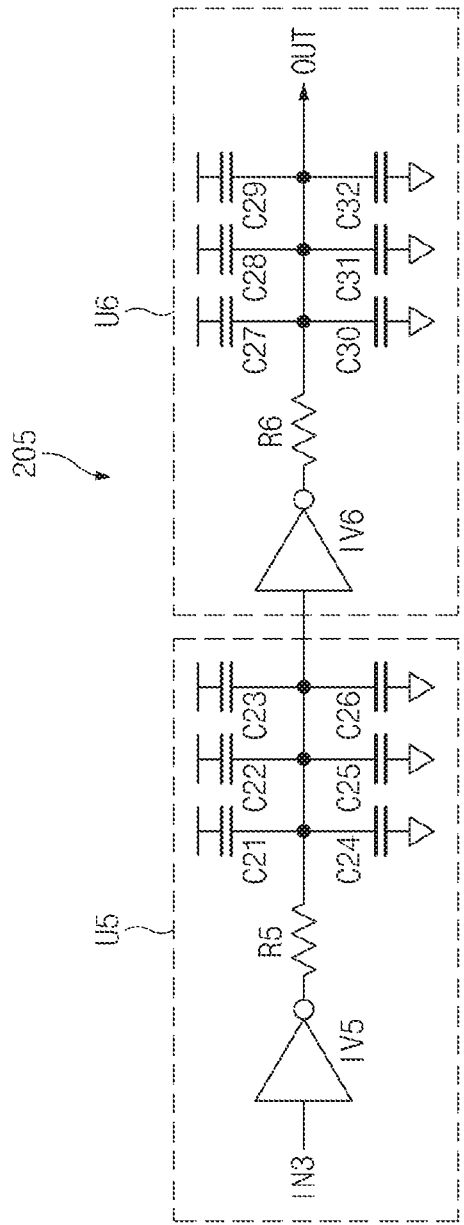
FIG. 6 is a detailed circuit diagram illustrating a representation of a delay circuit shown in FIG. 5.

FIG. 6 is a detailed circuit diagram illustrating a representation of the delay circuit 206 shown in FIG. 5.

Detailed structures of the plurality of delay circuits 205 to 207 are identical to one another, such that the embodiment of FIG. 6 will hereinafter be described using a detailed structure of the delay circuit 205 as an example. The description of the delay circuit 205 applies, however, to the N other delay circuits that may comprise the variable delay matching circuit 204.

The delay circuit 205 may include a pair of unit delay circuits U5 and U6, and may delay an input signal IN3 without inversion of the phase.

In this case, the unit delay circuit U5 may inversion-delay the input signal IN3. The unit delay circuit U5 may include an inverter IV5, a resistor R5, and a plurality of capacitors C21 to C26. The unit delay circuit U5 may delay the input signal IN3 by a capacitance value of the plurality of capacitors C21 to C26, and may output the delayed signal.

The inverter IV5 may inversion-drive the input signal IN3. One terminal of the resistor R5 may be coupled to an output terminal of the inverter IV5. In addition, capacitors C21 to C23 of a first group of capacitors from among the plurality of capacitors C21 to C26 may be coupled in parallel between a power-supply voltage terminal and one terminal of the resistor R5. Capacitors C24 to C26 of a second group of capacitors from among the plurality of capacitors C21 to C26 may be coupled in parallel between a ground voltage terminal and the other terminal, for example an output terminal, of the resistor R5.

The unit delay circuit U6 may inversion-delay the output signal of the unit delay circuit U5. The unit delay circuit U6 may include an inverter IV6, a resistor R6, and a plurality of capacitors C27 to C32. The unit delay circuit U6 may delay an output signal of the unit delay circuit U5 by a capacitance value of the plurality of capacitors C27 to C32, and may output the delayed signal.

The inverter IV6 may inversion-drive the output signal of the unit delay circuit U5. One terminal of the resistor R6 may be coupled to an output terminal of the inverter IV6. In addition, capacitors C27 to C29 of a first group of capacitors from among the plurality of capacitors C27 to C32 may be coupled in parallel between a power-supply voltage terminal and one terminal of the resistor R6. Capacitors C30 to C32 of a second group of capacitors from among the plurality of capacitors C27 to C32 may be coupled in parallel between a ground voltage terminal and the other terminal, for example an output terminal, of the resistor R6.

Figure 7:
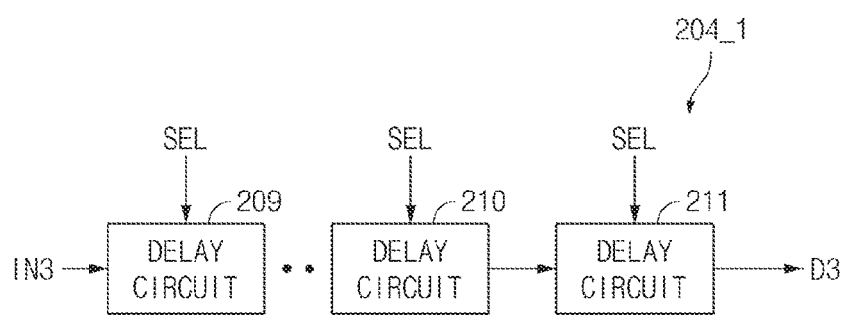
FIG. 7 is a block diagram illustrating a representation of an example variable delay matching circuit shown in FIG. 4 according to another embodiment of the present disclosure.

FIG. 7 is a block diagram illustrating a representation of another example of the variable delay matching circuit 204 shown in FIG. 4 according to another embodiment of the present disclosure. In the embodiment of FIG. 7, a reference number of the variable delay matching circuit is denoted by 204_1 for convenience of description.

The variable delay matching circuit 204_1 may include a plurality of delay circuits 209 to 211.

The plurality of delay circuits 209 to 211 may adjust a delay time of the input signal IN3, and may output a matching signal D3. That is, the plurality of delay circuits 209 to 211 may adjust a delay time of each delay circuit 209, 210 or 211 in response to the selection signal SEL, and may output a matching signal D3.

Although the embodiment of the present disclosure has exemplarily disclosed that the number of delay circuits 209 to 211 is set to 3 for convenience of description, the scope and spirit of the present disclosure is not limited thereto, and the number of delay circuits 209 to 211 may be changed as deemed necessary.

In looking briefly at FIG. 5, it is assumed that the number of delay circuits 205 to 207 is set to N. As a result, the selection circuit 208 may select an output signal of the delay circuit 207 of the last N-th stage or an output signal of the delay circuit 206 of the (N−1)-th stage.

For example, the selection circuit 208 may select the output signal of the delay circuit 207 when the selection signal SEL is at a first logic level, and may output the selection result as a matching signal D3. In contrast, the selection circuit 208 may select an output signal of the delay circuit 206 when the selection signal SEL is at a second logic level, and may output the selection result as a matching signal D3.

In other words, if the first buffer 201 of FIG. 4 is selected by the selection signal SEL, a relatively longer delay time may be used. In contrast, if the second buffer 202 is selected by the selection signal SEL, a relatively shorter delay time may be used.

Figure 8:
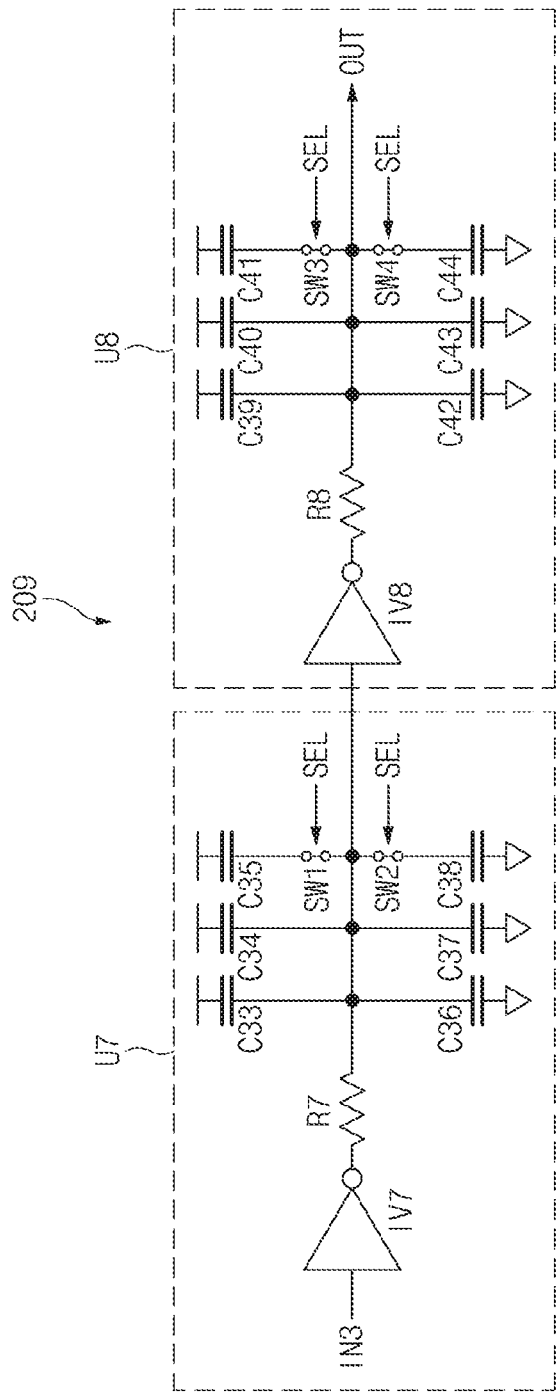
FIG. 8 is a detailed circuit diagram illustrating a representation of an example delay circuit shown in FIG. 7.

FIG. 8 is a detailed circuit diagram illustrating a representation of an example of the delay circuit 209 shown in FIG. 7. Detailed structures of the plurality of delay circuits 209 to 211 are identical to one another, such that the embodiment of FIG. 8 will hereinafter be described using a detailed structure of the delay circuit 209 as an example. The description of the delay circuit 209 applies, however, to the N other delay circuits that may comprise the variable delay matching circuit 204_1.

The delay circuit 209 may include a pair of unit delay circuits U7 and U8, and may delay an input signal IN3 without inversion of the phase.

In this case, the unit delay circuit U7 may inversion-delay the input signal IN3. The unit delay circuit U7 may include an inverter IV7, a resistor R7, a plurality of capacitors C33 to C38, and switches SW1 and SW2. The unit delay circuit U7 may delay the input signal IN3 by a capacitance value of the plurality of capacitors C33 to C38, and may output the delayed signal.

The inverter IV7 may inversion-drive the input signal IN3. One terminal of the resistor R7 may be coupled to an output terminal of the inverter IV7. In addition, capacitors C33 to C35 of a first group of capacitors from among the plurality of capacitors C33 to C38 may be coupled in parallel between a power-supply voltage terminal and one terminal, for example an output terminal, of the resistor R7. Capacitors C36 to C38 of a second group of capacitors from among the plurality of capacitors C33 to C38 may be coupled in parallel between a ground voltage terminal and the other terminal, for example an output terminal, of the resistor R7.

The capacitors C35 and C38 coupled to the last stage of the unit delay circuit U7 may be coupled to a plurality of switches including switches SW1 and SW2. The switch SW1 may be coupled to the capacitor C35 and the other terminal of the resistor R7, such that a switching operation of the switch SW1 may be controlled by the selection signal SEL. The switch SW2 may be coupled to the capacitor C38 and the other terminal of the resistor R7, such that a switching operation of the switch SW2 may be controlled by the selection signal SEL.

For example, if the selection signal SEL is at a first logic level, the switches SW1 and SW2 may be turned on. As a result, a capacitance value of the unit delay circuit U7 increases by the capacitors C35 and C38, such that a relatively longer delay time may be used.

In contrast, if the selection signal SEL is at a second logic level, the switches SW1 and SW2 may be turned off. Connection between the unit delay circuit U7 and the capacitors C35 and C38 is cut off, and a capacitance value of the unit delay circuit U7 is reduced, such that a relatively shorter delay time may be used.

The unit delay circuit U8 may inversion-delay the output signal of the unit delay circuit U7. The unit delay circuit U8 may include an inverter IV8, a resistor R8, a plurality of capacitors C39 to C44, and switches SW3 and SW4. The unit delay circuit U8 may delay the output signal of the unit delay circuit U7 by a capacitance value of the plurality of capacitors C39 to C44.

The inverter IV8 may inversion-drive the input signal IN3. One terminal of the resistor R8 may be coupled to an output terminal of the inverter IV8. Capacitors C39 to C41 of a first group of capacitors from among the plurality of capacitors C39 to C44 may be coupled in parallel between a power-supply voltage terminal and the other terminal, for example an output terminal, of the resistor R8. Capacitors C42 to C44 of a second group of capacitors from among the plurality of capacitors C39 to C44 may be coupled in parallel between a ground voltage terminal and the other terminal of the resistor R8.

Capacitors C41 and C44 coupled to the last stage of the unit delay circuit U8 may be coupled to a plurality of switches including the switches SW3 and SW4. The switch SW3 may be coupled to the capacitor C41 and the other terminal of the resistor R8, such that a switching operation of the switch SW3 may be controlled by the selection signal SEL. The switch SW4 may be coupled to the capacitor C44 and the other terminal of the resistor R8, such that a switching operation of the switch SW4 may be controlled by the selection signal SEL.

For example, if the selection signal SEL is at a first logic level, the switches SW3 and SW4 may be turned on. As a result, a capacitance value of the unit delay circuit U8 increases by the capacitors C41 and C44, such that a relatively longer delay time may be used.

In contrast, if the selection signal SEL is at a second logic level, the switches SW3 and SW4 may be turned off. Connection between the unit delay circuit U8 and the capacitors C41 and C44 is cut off, and a capacitance value of the unit delay circuit U8 is reduced, such that a relatively shorter delay time may be used.

Figure 9:
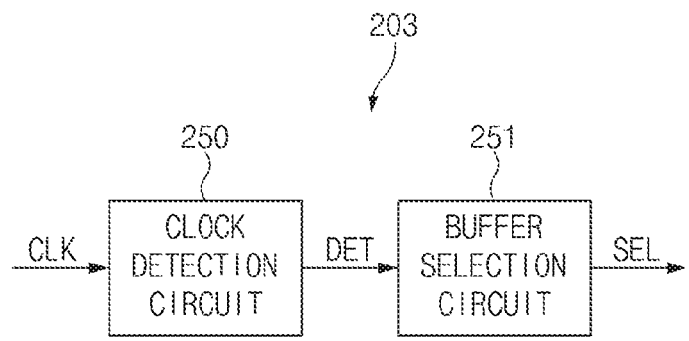
FIG. 9 is a detailed circuit diagram illustrating a representation of an example selection controller shown in FIG. 4.

FIG. 9 is a detailed circuit diagram illustrating a representation of an example of the selection controller 203 shown in FIG. 4. Because the selection controller 105 of FIG. 1 is identical in structure to the selection controller 203 of FIG. 4, the embodiment of FIG. 9 will hereinafter be described using the detailed structure of the selection controller 203 as an example.

The selection controller 203 may include a clock detection circuit 250 and a buffer selection circuit 251. The clock detection circuit 250 may detect a frequency of an internal clock signal CLK, and may thus output a detection signal DET having frequency information. The buffer selection circuit 251 may control the selection signal SEL for selecting a buffer or a delay time of the variable delay matching circuit 204 in response to the detection signal DET.

The selection controller 203 may detect a frequency of the internal clock signal CLK, may identify a high-speed operation mode or a low-speed operation mode, and may generate the selection signal SEL in response to the identified operation mode information.

Figure 10:
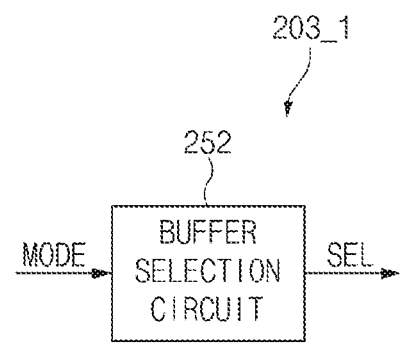
FIG. 10 is a block diagram illustrating a representation of an example selection controller shown in FIG. 4 according to another embodiment of the present disclosure.

FIG. 10 is a block diagram illustrating a representation of an example of the selection controller 203 shown in FIG. 4 according to another embodiment of the present disclosure. In the embodiment of FIG. 10, a reference number of the selection controller is denoted by 203_1 for convenience of description.

The selection controller 203_1 may include a buffer selection circuit 252 controlled by a mode signal MODE. The buffer selection circuit 252 may control the selection signal SEL upon receiving the mode signal MODE from an external part. In this case, the mode signal MODE may include operation mode information received from an external controller, an application processor AP, a central processing unit CPU, or the like.

For example, if the application processor AP or the central processing unit CPU is applied to MP3, video, games, etc., the buffer selection circuit 252 may receive operation mode information such as a mode signal MODE, and may control the selection signal SEL for buffer selection.

Figure 11:
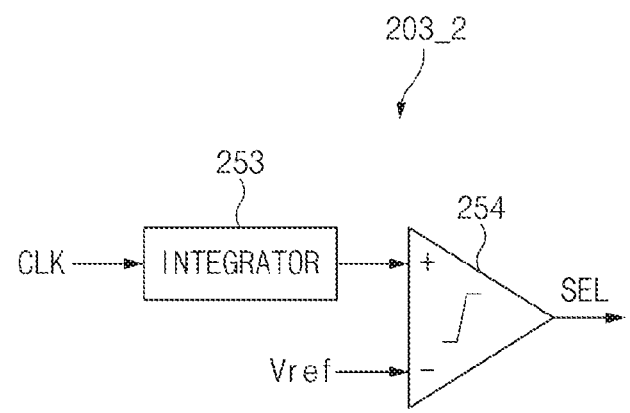
FIG. 11 is a circuit diagram illustrating a representation of an example selection controller shown in FIG. 4.

FIG. 11 is a circuit diagram illustrating a representation of an example of the selection controller 203 shown in FIG. 4. In the embodiment of FIG. 11, a reference number of the selection controller is denoted by 203_2 for convenience of description.

Referring to FIG. 11, the selection controller 203_2 may include an integrator 253 and a comparator 254. In this case, the integrator 253 may convert a clock frequency into a voltage level by integrating the clock signal CLK. The comparator 254 may compare an output voltage of the integrator 253 with a reference voltage VREF, and may output a selection signal SEL.

For example, the selection controller 203_2 may output the selection signal SEL having a first logic level when an integration value of the clock signal CLK is higher than the reference voltage VREF. In contrast, the selection controller 203_2 may output the selection signal SEL having a second logic level when an integration value of the clock signal CLK is lower than the reference voltage VREF.

Figure 12:
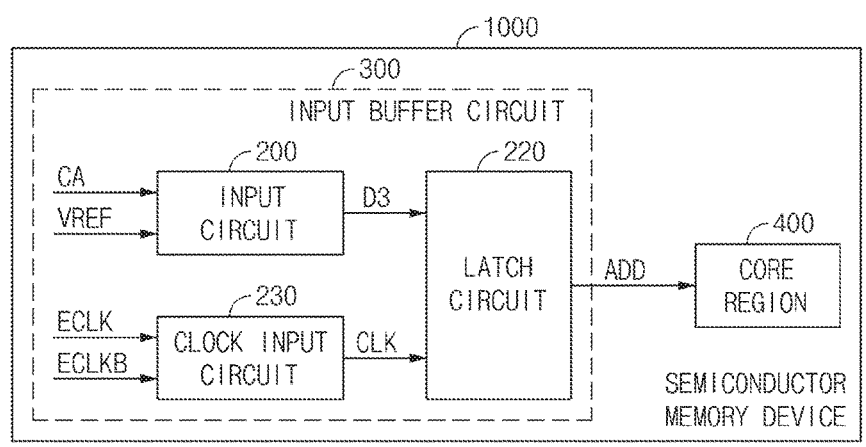
FIG. 12 is a block diagram illustrating a semiconductor memory device according to another embodiment of the present disclosure.

FIG. 12 is a block diagram illustrating a semiconductor memory device according to another embodiment of the present disclosure.

Referring to FIG. 12, a semiconductor memory device 1000 may include an input buffer circuit 300 and a core region 400.

The input buffer circuit 300 may buffer a command address CA received from an external controller, and may generate an address ADD by synchronizing with the external clock ECLK. The input buffer circuit 300 may include an input circuit 200, a latch circuit 220, and a clock input circuit 230.

The input buffer circuit 300 of FIG. 12 may be implemented as the input buffer circuit or any associated components illustrated in FIGS. 4 to 11. However, the input buffer circuit 300 of FIG. 12 may also be implemented as the input buffer circuit or any associated components illustrated in FIGS. 1 to 3.

An internal operation of the core region 400 may be controlled in response to the address ADD received from the input buffer circuit 300. That is, the core region 400 may read data from the cell array or may write data in the cell array according to the address ADD.

As is apparent from the above description, the input buffer circuit according to the embodiments reduces a delay offset of a receiver circuit including a plurality of input buffers having different characteristics, resulting in an increased timing margin.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An input buffer circuit comprising:
a first buffer configured to buffer a command address received based on a selection signal;

a second buffer configured to buffer the command address based on the selection signal, and have characteristics different from those of the first buffer; and a variable delay matching circuit configured to delay an output signal of the first buffer and an output signal of the second buffer, and control a delay time in different ways according to the selection signal.

2. The input buffer circuit according to claim 1, wherein the first buffer and the second buffer operate in a complementary manner based on the selection signal.

3. The input buffer circuit according to claim 1, further comprising:

a selection controller configured to generate the selection signal based on an external operation mode signal.

4. The input buffer circuit according to claim 1, further comprising:

a selection controller configured to generate the selection signal based on a frequency of an internal clock.

5. The input buffer circuit according to claim 1, further comprising:

a selection controller configured to generate the selection signal based on a signal acquired when an integration value of an internal clock is compared with a predetermined reference voltage.

6. The input buffer circuit according to claim 1, further comprising:

a latch circuit configured to latch an output signal of the variable delay matching circuit based on a clock signal, and output an address.

7. The input buffer circuit according to claim 1, wherein the variable delay matching circuit includes:

N delay circuits configured to delay the output signal of the first buffer or the output signal of the second buffer; and a selection circuit configured to select any one of an output signal of an N-th delay circuit and an output signal of an (N−1)-th delay circuit from among the N delay circuits based on the selection signal.

8. The input buffer circuit according to claim 7, wherein:

each of the N delay circuits includes one pair of unit delay circuits, wherein each of the unit delay circuits includes:

an inverter configured to invert an input signal input into the inverter;

a resistor coupled to an output terminal of the inverter; and a plurality of capacitors coupled in parallel to an output terminal of the resistor.

9. The input buffer circuit according to claim 1, wherein the variable delay matching circuit includes:

a plurality of delay circuits configured to delay the output signal of the first buffer or the output signal of the second buffer, wherein delay times of the respective delay circuits are adjusted based on the selection signal.

10. The input buffer circuit according to claim 9, wherein:

each of the N delay circuits includes one pair of unit delay circuits, wherein each of the unit delay circuits includes:

an inverter configured to invert an input signal input into the inverter;

a resistor coupled to an output terminal of the inverter;

a plurality of capacitors coupled in parallel to an output terminal of the resistor; and a plurality of switches configured to control connection between one terminal of the resistor and the plurality of capacitors based on the selection signal, and coupled to at least one of the plurality of capacitors.

11. The input buffer circuit according to claim 1, wherein the variable delay matching circuit is configured to adjust a delay time by adjusting the number of turned-on capacitors based on a logic level of the selection signal.

* * * * *